(12) United States Patent
Torres et al.

(10) Patent No.: US 9,523,586 B2
(45) Date of Patent: Dec. 20, 2016

(54) METHODS AND APPARATUS FOR SEALED COMMUNICATION INTERFACES

(71) Applicant: Itron, France, Issy-les-Moulineaux (FR)

(72) Inventors: Matthieu Torres, Bereziat (FR); Denis Guillot-Jerome, Buellas (FR); Vincent Rigomier, Saint Martin Belle Roche (FR)

(73) Assignee: ITRON GLOBAL SARL, Liberty Lake, WA (US)

( * ) Notice: Subject to any disclaimer, the term of this patent is extended or adjusted under 35 U.S.C. 154(b) by 101 days.

(21) Appl. No.: 14/641,042

(22) Filed: Mar. 6, 2015

(65) Prior Publication Data

US 2016/0258780 A1    Sep. 8, 2016

(51) Int. Cl.
| | | |
|---|---|---|
| G01R 21/00 | (2006.01) | |
| G01D 4/00 | (2006.01) | |
| H05K 5/06 | (2006.01) | |
| G01R 22/06 | (2006.01) | |
| G01F 15/14 | (2006.01) | |

(52) U.S. Cl.
CPC ............ *G01D 4/002* (2013.01); *G01F 15/14* (2013.01); *G01R 21/00* (2013.01); *G01R 22/061* (2013.01); *G01R 22/065* (2013.01); *H05K 5/06* (2013.01)

(58) Field of Classification Search
CPC ..... G01R 21/00; G01R 22/061; G01R 22/065; G01F 15/14
See application file for complete search history.

(56) References Cited

U.S. PATENT DOCUMENTS

| | | | | |
|---|---|---|---|---|
| 4,491,791 A | * | 1/1985 | Balch | G01R 21/00 250/551 |
| 4,491,792 A | * | 1/1985 | Bullock | G01R 21/00 250/551 |
| 5,057,767 A | * | 10/1991 | Keturakis | G01R 22/065 324/156 |

(Continued)

FOREIGN PATENT DOCUMENTS

| | | |
|---|---|---|
| EP | 2503298 | 9/2012 |
| WO | 2013063249 | 5/2013 |

OTHER PUBLICATIONS

Patent Cooperation Treaty, "International Search Report and Written Opinion," issued in connection with PCT Patent Application No. PCT/EP2016/054645, mailed on May 17, 2016, 12 pages.

(Continued)

*Primary Examiner* — Andrew Bee
(74) *Attorney, Agent, or Firm* — Hanley, Flight & Zimmerman, LLC

(57) ABSTRACT

Methods and apparatus for sealed communication interfaces are disclosed. One example apparatus includes a translucent portion of a sealing gasket to allow signals to pass therethrough, a sealing wall of the gasket to define a substantially environmentally-isolated zone proximate the translucent portion, and a transmitter to transmit a signal across the translucent portion. The example apparatus also includes a receiver to detect a reflected signal corresponding to the transmitted signal, where the detection enables data communications across the translucent portion, and where the reflected signal is to be reflected from a surface on an opposite side of the translucent portion from the transmitter and receiver.

20 Claims, 7 Drawing Sheets

(56) References Cited

U.S. PATENT DOCUMENTS

| | | |
|---|---|---|
| 6,975,812 B1 | 12/2005 | Kuhara et al. |
| 7,896,708 B2 | 3/2011 | Agevik |
| 8,344,900 B2 | 1/2013 | Fariello et al. |
| 2009/0106568 A1 | 4/2009 | James |
| 2013/0094125 A1 | 4/2013 | Schwartz et al. |
| 2013/0315533 A1 | 11/2013 | Tay et al. |
| 2014/0361908 A1 | 12/2014 | Laird et al. |
| 2014/0375116 A1* | 12/2014 | Deneszczuk .............. B60L 3/04 307/9.1 |

OTHER PUBLICATIONS

ITRON, "CF 51, Heat and cooling Meter Calculator," Data Sheet, 2012, 2 pages.
ITRON, "EquaScan Master RF," Data Sheet, 2013, 2 pages.
ITRON, "EquaScan wMIU RF," Data Sheet, 2013, 2 pages.
ITRON, "CF-Ultra Maxx MK," [https://www.itron.com/aunz/productsAndServices/Pages/CF-UltraMaxe%20MK.aspx], accessed on Mar. 5, 2015, 2 pages.
ITRON, "CF 51, Calculator for Heat Meters," [https://www.itron.com/mxca/en/productsAndServices/Pages/CF%2051.aspx], accessed on Mar. 5, 2015, 2 pages.

* cited by examiner

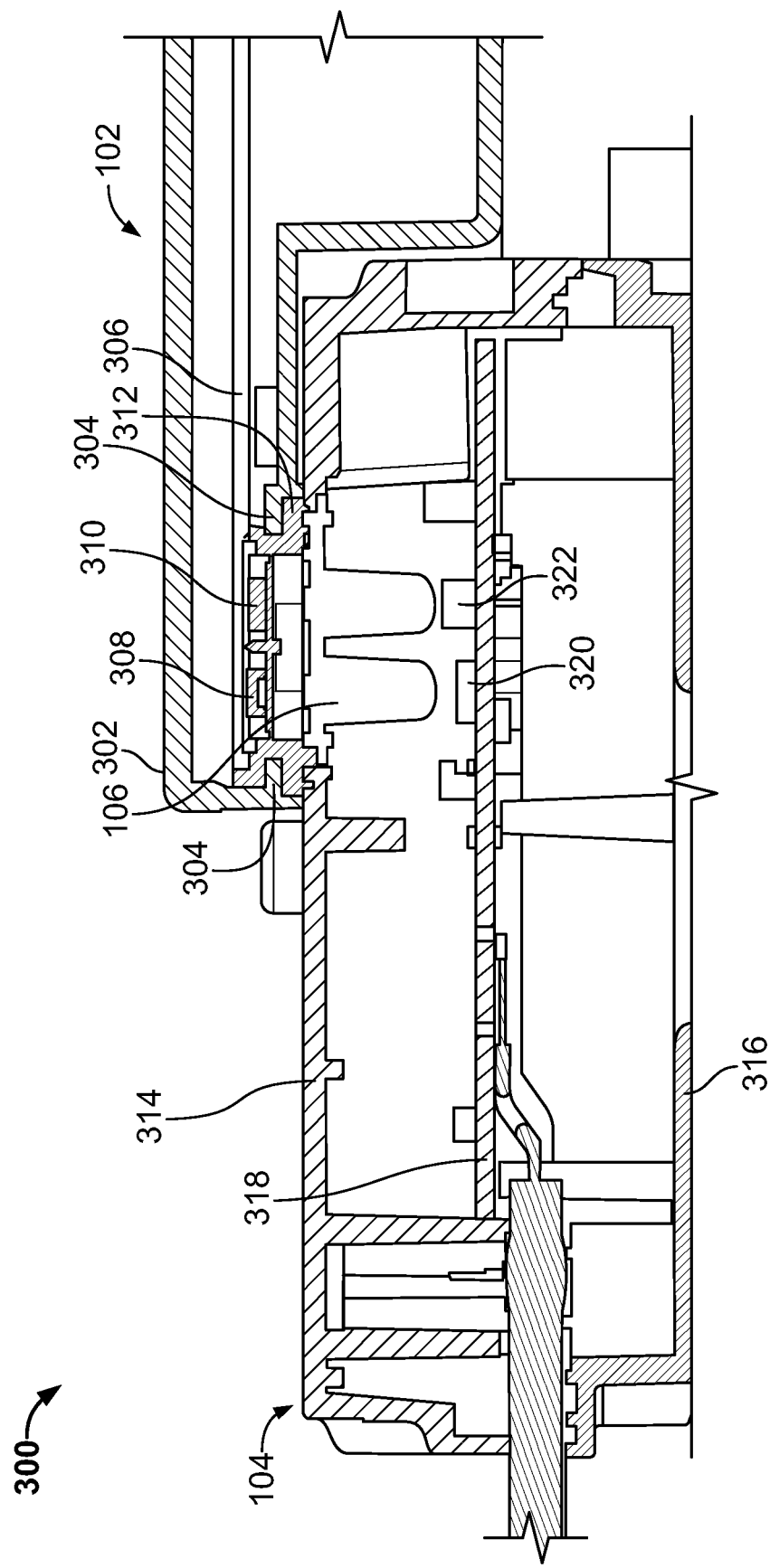

METHODS AND APPARATUS FOR SEALED COMMUNICATION INTERFACES

FIELD OF THE DISCLOSURE

This disclosure relates generally to communication interfaces, and, more particularly, to methods and apparatus for communication interface seals.

BACKGROUND

Utility metering systems typically have module devices that communicate with a terminal interface (e.g., a utility meter, a sensor, a communication device or interface coupled to a utility measuring device) via a communication interface. Such communication interfaces are often located in harsh environmental conditions (e.g., outdoor environments, etc.) that may require sealing. In particular, utility metering communication systems in harsh environmental conditions often have communication interfaces that involve modules, which may be handheld devices, to connect and/or interface with utility metering systems and/or components (e.g., utility terminals, measurement terminals) to exchange data and/or diagnose the utility metering systems. In these types of environments, it is often difficult to seal, protect and/or isolate an interface (e.g., an interface connection) between modules (e.g., handheld modules) and utility metering systems (e.g., a utility terminal).

Some known sealing solutions for utility metering equipment include gaskets (e.g., rubber gaskets) to provide an interface seal between a module and a terminal of a utility metering system, for example. However, use of these gaskets often results in exposed contacts (e.g., contact terminals) and/or circuitry when the interface is not sealed and/or not in a coupled state. In particular, when the module is unplugged from the terminal, for example, the contacts for either the module and/or the terminal may be exposed, thereby resulting in potential damage, exposure and/or corrosion of the contacts. In some examples, a removable cover (e.g., a removable plug cover) is used to cover and/or protect either side of the communication interface and may be removed after the module and the terminal are coupled to one another. However, removable covers may be lost after being removed once and/or may fall off or become lost, thereby exposing the contacts to the environment.

BRIEF DESCRIPTION OF THE DRAWINGS

FIG. 3. is a cross-sectional view of an example interface system in accordance with the teachings of this disclosure.

Figure 1:
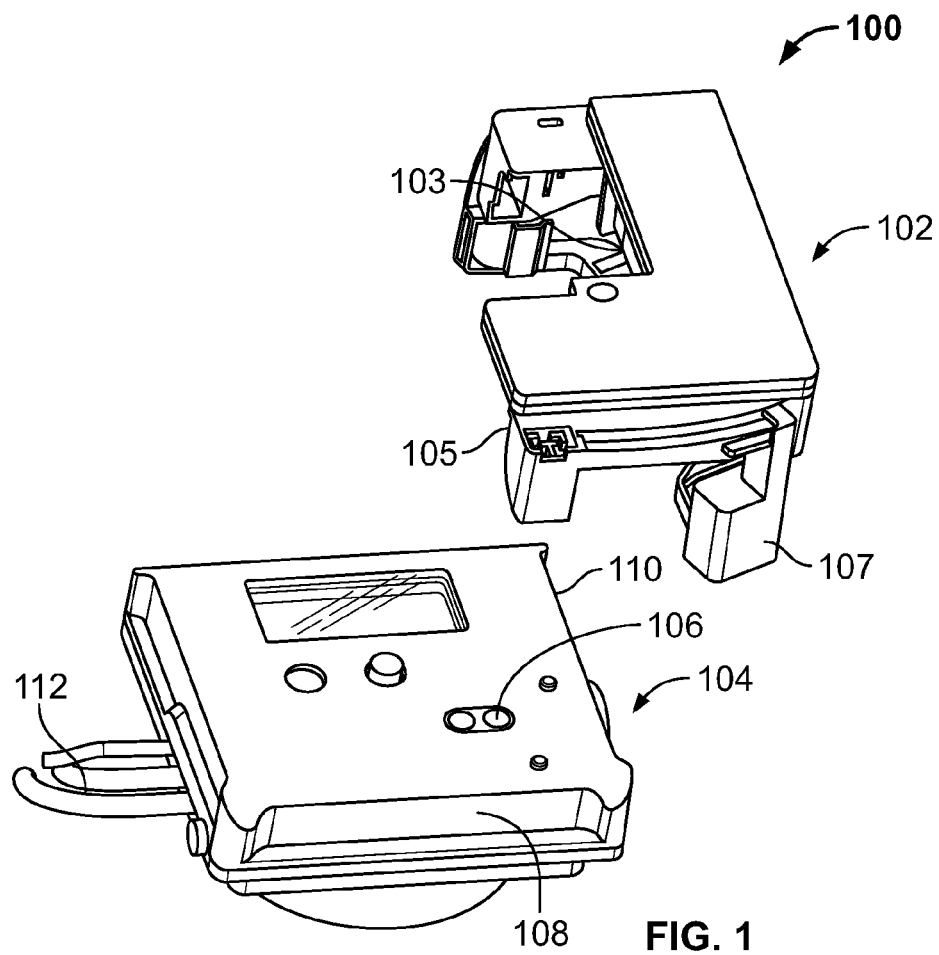
FIG. 1 illustrates an interface, in which the examples disclosed herein may be implemented, and where an example module and an example utility terminal are in an uncoupled state.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Methods and apparatus for sealed communication interfaces are disclosed herein. Utility metering systems often include modules that are coupled to a terminal interface of a utility metering system (e.g., a utility measuring device), thereby defining a communication interface, which is typically used for data exchange and/or diagnosis of a utility meter. Some known communication interfaces rely on sealing to protect contacts and/or terminals of the interface system from being damaged due to exposure to an external environment (e.g. an outdoor environment). In these known interface systems, it can be difficult to isolate exposed terminals and/or contacts from the external environment, thereby exposing them to corrosion and/or foreign matter (e.g., debris, liquid, etc.) that may damage or prevent proper operation of the terminals and/or contacts.

Some known utility metering systems employ gaskets (e.g., rubber gaskets) to provide an interface seal at a communication interface between a module (e.g., an interface module) and a terminal (e.g., a communication terminal of a utility meter). The gaskets often have openings to allow contacts of the communication interface, for example, to establish an electrical connection and/or a communication interface. To reduce exposure of the contacts, a removable cover (e.g., a plug cover, a protective cover, etc.) is sometimes used to cover and/or attach to the contacts to isolate the contacts and/or communication circuitry/components from the external environment. These covers are often lost after being removed and/or allow exposure to the contacts when they are removed (e.g., during coupling of the module to the terminal).

In known light-based communication interfaces (e.g., infrared, fiber-optic, etc.), sealed interfaces may still leave some elements (e.g., transducers and/or transmitter/receivers, etc.) exposed to the environment and/or require significant design complexity to align transmitter/receiver pairs, for example. In some light-based communication systems, light-loss and/or unintended reflection can cause issues with communications and/or functionality (e.g., reflected light from an transmitter reflects to a receiver on one communication side, light bleed, parasitic light, etc.), thereby affecting the overall reliability of the communication interface.

The examples disclosed herein allow sealed communication interfaces to prevent environmental exposure to components even in an uncoupled (e.g., an unterminated) state or a coupled (e.g., a terminated) state. The examples disclosed herein enable outdoor operating equipment that requires environmental protection (e.g., environmental sealing, etc.) by preventing communication interfaces and/or components from being exposed to outdoor elements (water, ice, temperature extremes, etc.) and/or from failure (e.g., corrosion of contacts, damage to the interface components, etc.) while allowing reliable communications. The examples disclosed herein allow a communicative and/or mechanical coupling to occur at a communication interface without exposure of communication related interface components (e.g., terminals, transmitter/receiver pairs, transducers, etc.) to an external environment in a cost-effective manner.

To provide the seals described above, the examples disclosed herein use a sealing gasket (e.g., an interface gasket) with a translucent portion for a communication interface, in which light-based communications such as infrared (IR) or fiber-optics pass through the translucent portion while a seal is maintained in either a coupled or an uncoupled state of the interface. In some examples, the sealing gasket has a wall to isolate a transmitter/receiver pair to prevent light from traveling therebetween. Such a transmission of light between the transmission/receiver pair may result in malfunction of the interface and/or the transmitter/receiver pair in general.

Some known interface systems such as those shown in U.S. Patent Application No. 2009/01060568 A1, which was filed on Oct. 22, 2008, and is hereby incorporated by reference in its entirety, rely on a secondary sensor to detect a connection. In this known example, a peripheral sensor, which may be infrared, is used to sense a presence of a connection in addition to the electrical data connection itself These additional connection sensing systems may pose significant costs, significant design complexity and/or issues with reliability (e.g. additional maintenance and servicing expenses). The examples disclosed herein allow detection of a connection between a module and a terminal.

Additionally, the examples disclosed herein also enable a power-saving configuration (e.g., portions of the circuitry are switched off and/or not provided power) and can switch to different power configurations, for example, when a connection is detected. In particular, transmissions from a transmitter of a transmitter/receiver pair are reflected back by one or more features of another mating component to a receiver of the transmitter/receiver pair and detected by the receiver to determine a presence of a connection. In other words, the examples disclosed herein use the actual interface communications instead of a secondary detection system to detect a presence of a coupling or a connection (e.g., use of a primary data connection method to sense a connection).

As used in the examples disclosed herein, the terms "sealed," "environmentally-isolated" or "substantially environmentally-isolated" refer to an enclosure, zone and/or volume that is substantially resistant to fluids, fluid pressure, particles, etc. and not necessarily perfectly isolated. The terms "sealed," "environmentally-isolated" or "substantially environmentally-isolated" may refer to an isolation standard such as an IP65, IP67 or IP68 certified enclosure, etc., for example. As used herein, the terms "seal," "sealing" or "sealed" refer to substantially environmentally-isolated areas, volumes and/or zones. As used herein, the term "translucent" may mean partially or substantially translucent (e.g., allowing a portion of light to travel therethrough) and/or partially transparent.

FIG. 1 illustrates an example interface 100, in which the examples disclosed herein may be implemented. The example interface 100 includes an example module 102 and an example utility data terminal (e.g., a heat meter, a heat meter calculator, etc.) 104 in an uncoupled state. The module 102 of the illustrated example includes aligning surfaces 103 and 105, and a latch 107. The example terminal 104 includes a lens (e.g., a communication portal, a window, etc.) 106, aligning surfaces 108 and 110, and has communication wires 112 extending out of the terminal 104 for communications with a measuring device, for example. In this example, the module 102 communicates with the utility data terminal 104 through the lens 106 via a light-based interface, which is infrared.

In this example, the module 102 and the terminal 104 are used in a utility metering system where data (e.g., utility consumption data, configuration data) is exchanged between the module 102 and the terminal 104. In this example, the utility data terminal 104 collects and/or stores data related to utility metering device such as a heat meter, which is in communication with the terminal 104, to measure thermal energy provided or delivered to a zone, for example. For example, the terminal 104 of the illustrated example may be communicatively coupled to the heat meter that includes a fluid flow meter (e.g., a turbine-type fluid flow meter, an ultrasonic flow meter, etc.) and temperature measuring device such as a thermocouple. In this example, the heat meter and/or the utility data terminal 104 utilizes temperature measurements from the thermocouple in combination with measured flow rate(s) from the fluid flow meter to calculate an aggregate heat transfer (bulk heat transfer, bulk heat transfer rate, averaged heat use, etc.).

The module 102 of the illustrated example collects heat data corresponding to the utility metering device from the terminal 104. In some examples, the module 102 is handheld and a user in the field carries the module 102 between terminals to collect heat data (e.g., data related to heat provided, heat utilized, etc.) from each terminal, for example. In some examples, the heat data is used for consumption analysis, verification of utility records and/or billing information. Additionally or alternatively, the module 102 is a portable radio device attached to the terminal 104 and used to transmit heat data to a network for billing, consumption analysis, etc. In some examples, the module 102 is used to update firmware of the terminal 104 and/or perform diagnostics of the terminal 104 and/or the utility metering device.

Figure 2:
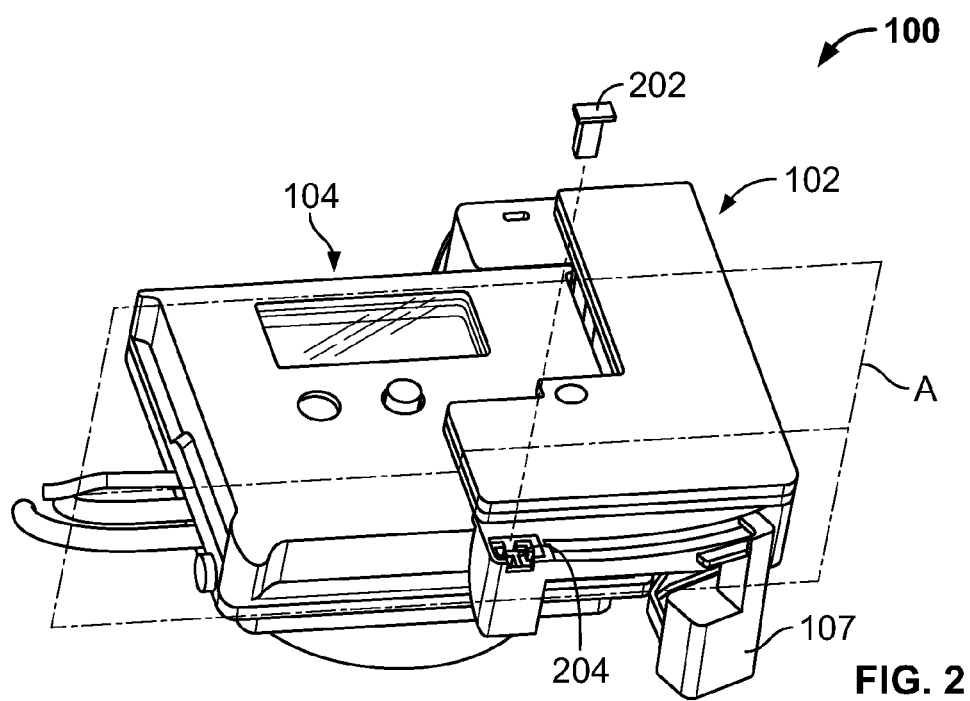
FIG. 2 illustrates the example interface of FIG. 1 where the example module and the example terminal are in a coupled state.

FIG. 2 illustrates the example interface 100 of FIG. 1 in a terminated state, in which the module 102 of the illustrated example has been coupled and/or aligned to the terminal 104. In particular, the surface 103 of the module 102 has been aligned to the surface 110 of the terminal 104. Likewise, the surface 105 of the module 102 has been aligned to the surface 108 of the terminal 104.

In this example, the module 102 is fastened to the terminal 104 via a coupling part (e.g., a fastener, a clip, a clasp, etc.) 202, which may be received by an opening 204, and/or the latch 107. Because of this coupling, the module 102 is now able to communicate with the terminal 104 for data exchanges and/or to receive diagnostic data of a utility metering device that is integral with the terminal 104 or attached (e.g., mechanically coupled) to the terminal 104. The data exchanges, in some examples, include data transfer of the calculated heat transfer/provided at the utility metering device. Alternatively, the example interface 100 may be used for firmware upgrades of the utility metering device, diagnosis of the utility metering device and/or for service or maintenance of the utility data terminal 104 or the utility metering device. Often, interfaces such as the example interface 100 are located in outdoor environments, which may subject these interfaces to potential damage and/or abnormal function because of exposure to the elements (e.g., water, humidity, temperature extremes, etc.).

FIG. 3 is a cross-sectional view of an example interface system 300 in accordance with the teachings of this disclosure taken along a plane A of FIG. 2. In this example, the module 102 and the terminal 104 are coupled together for communications (e.g., infrared communications) therebetween. The example module 102 of the interface system 300 includes a housing (e.g., an enclosure, a casing, etc.) 302 of the module 102 with retention tabs 304, a printed circuit board (PCB) 306 with a transmitter 308 and a receiver 310 along with communication circuitry, and an interface gasket (e.g., a sealing gasket, a seal, a sealing interface, etc.) 312. The example terminal 104 of the interface system 300 includes a front housing 314, the lens 106, which is assembled and/or aligned to the housing 314, a rear housing 316 and a printed circuit board 318 that mounts a receiver 320 and a transmitter 322 along with communication circuitry.

In this example, the interface gasket 312 of the illustrated example is positioned within (e.g., assembled to) the module 102 and is to contact the terminal 104 and aligned relative to the lens 106. In particular, the interface gasket 312 is assembled and/or coupled to the housing 302 by the retention tabs 304, thereby retaining the interface gasket 312 and aligning the interface gasket 312 relative to a first transmitter/receiver pair, which includes the transmitter 308 and the receiver 310, to the lens 106, for example. Likewise, a second transmitter/receiver pair that includes the receiver 320 and the transmitter 322 is aligned by placement of the printed circuit board 318 relative to the housing 316, which in turn positions the lens 106 relative to the second transmitter/receiver pair, for example.

In some examples, the interface gasket 312 is pushed through the retention tabs 304 while being elastically deformed to assemble and/or couple the interface gasket 312 to the housing 302 (e.g., the interface gasket 312 is "snapped" into the housing 302 by the retention tabs 304). In these examples, this assembly and/or coupling process can define or partially define a substantially sealed volume of the module 102. Additionally or alternatively, in some examples, the interface gasket 312 is mechanically coupled to (e.g., adhered to, screwed into, welded to, etc.) the housing 302. Alternatively, the interface gasket 312 may be aligned and/or retained by the outer housing 314 of the terminal 104 (e.g., the interface gasket 312 is pre-assembled to the terminal 104 prior to the terminal 104 being coupled to the module 102), which may define a substantially sealed volume of the terminal 104, for example. In other examples, there are no transmitter/receiver pairs, and a single transmitter/receiver of the module 102 communicates to a single transmitter/receiver of the terminal 104 (e.g., a single two-way communication path).

Figure 4A:
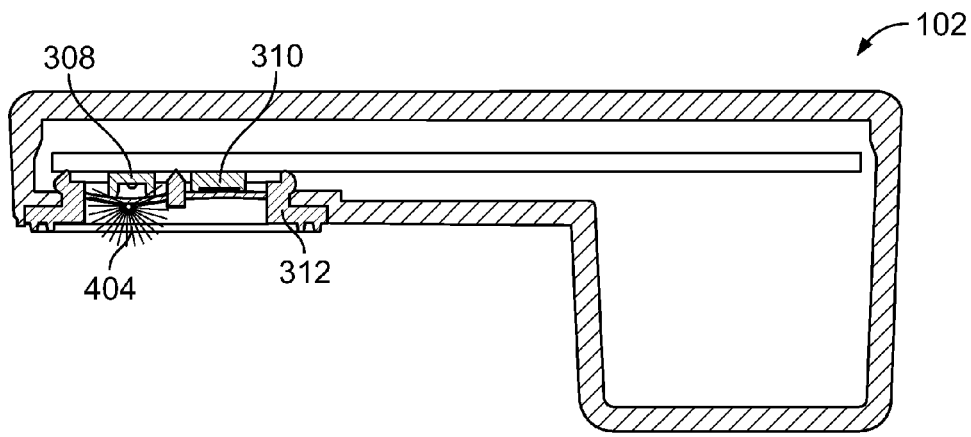
FIG. 4A is a cross-sectional view of the example module of FIG. 1 in an uncoupled state.

The operation of the example interface system 300 of FIG. 3 is described below in greater detail in connection with FIGS. 4A-4C. FIG. 4A is a cross-sectional view of the example module 102 of FIG. 1 in an un-coupled state (e.g., the module 102 is not coupled to the terminal 104). In particular, the interface gasket 312 of the illustrated example is pre-assembled to the module 102. In this example, the interface gasket 312 seals the module 102 and/or is one of the seals of the module 102 (e.g., the assembly and/or coupling of the interface gasket 312 forms a seal of the module 102 even in an uncoupled state of the module 102).

In some examples, the transmitter 308 is in direct contact with the interface gasket 312, thereby partially deforming the interface gasket 312 (e.g., elastically deforming the interface gasket 312) around a portion of the transmitter 308. In particular, a translucent portion 502, which will be described in detail below in connection with FIG. 5, of the interface gasket 312 contacts the transmitter 308 and may conform to the shape of the portion of the transmitter 308.

In operation, the transmitter 308 transmits a signal (e.g., a strobe signal, a pulsed signal and/or a periodic signal) 404 to be used by the module 102 to determine whether the module 102 is coupled to a terminal such as the terminal 104. In this example, because the module 102 is not coupled to a terminal, the signal 404 disperses and is not detected by the receiver 310. In particular, geometric features of the interface gasket 312, which are to be described below in greater detail in connection with FIGS. 5-8, substantially prevent the signal 404 from traveling to the receiver 310. In this example, the transmitter directly contacting the interface gasket 312 further reduces reflections of the transmitter 308 and/or reflections to the receiver 310 (e.g., light bleed, parasitic light, etc.) by dispersing the signal 404 away from the receiver 310.

In some examples, the signal 404 is periodically sent to detect whether a terminal is coupled to the module 102. A polling period (e.g., a strobe time, etc.) used for this detection may be any appropriate time interval (e.g., milliseconds, seconds, minutes, hours, days, etc.). In some examples, the time interval is determined by detected conditions of the module 102. For example, the module 102 may increase the polling period to days after not detecting a coupling to a terminal for a day. Additionally or alternatively, the polling period may be reduced by the module 102 to seconds or milliseconds based on a detected motion of the module 102 by an accelerometer or a light sensor, for example (e.g., detected motion through a motion sensor, detected light changes through a light sensor, etc.). The increased polling time, in some examples, may be attributed to a reduced power consumption and/or power savings of the interface system 300.

Figure 4B:
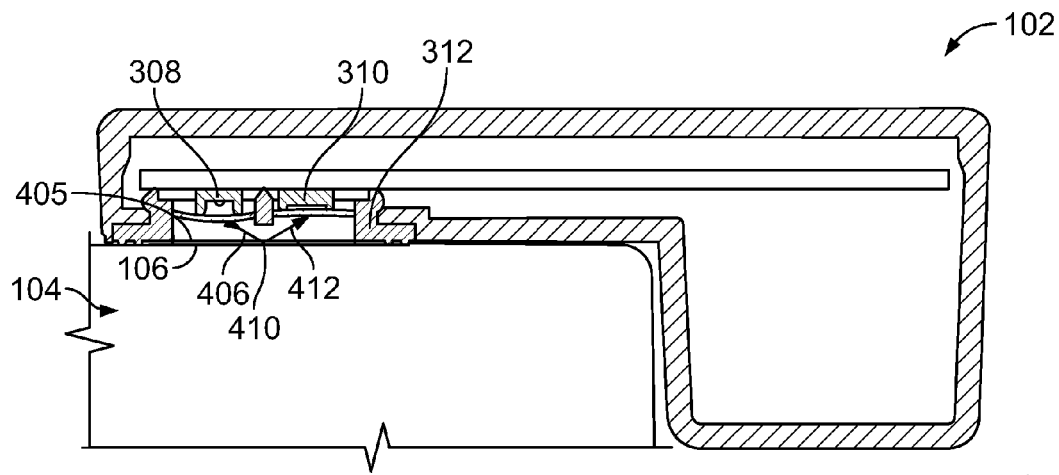
FIG. 4B is a cross-sectional view of the example module and the example terminal of FIG. 1 coupled together.

FIG. 4B is a cross-sectional view of the example module 102 and the example terminal 104 of FIG. 1 in a coupled state (e.g., a terminated state). The interface gasket 312 of the illustrated example is adjacent and in contact with a surface 405 of the lens 106 that is mounted and/or assembled to the terminal 104. In this example, a portion 406 of a transmitted signal from the transmitter 308 is reflected from the lens 106 of the terminal 104 at a reflection point 410 of the surface 405 as a reflected ray 412 instead of being dispersed as shown in the example of FIG. 4A. In this example, the reflected ray 412 is then received at the receiver 310, thereby triggering the transmitter 308 to transmit signals to the terminal 104 and the receiver 310 to receive signals from the terminal 104 through the interface gasket 312. In other words, receiving the reflected ray 412 at the transmitter 308 causes the module 102 to determine that the module 102 is coupled to the terminal 104. In particular, a processor of the module 102 may compare and/or analyze transmissions from the transmitter 308 to reflected signals received at the receiver 310 to verify that the receiver 310 is receiving reflections of the transmitted signals from the transmitter 308.

In some examples, the reflection point 410 may be defined by the geometry and/or position of the lens 106 of the terminal 104. For example, a concave or convex shape at the center of the lens 106 may be used to define reflective angles of transmitted signals from the transmitter 308. In some examples, varying a position of the reflection point 410 may be used to prevent incompatible devices from communicating with the module 102 (e.g., the reflected signal 412 is directed away from the receiver 310 based on geometry of the lens 106 when a terminal is incompatible with the module 102, etc.). In some examples, the lens 106 has reflective portions (e.g., a mirror portion, a reflective coating, etc.), is tinted, and/or is partially opaque to facilitate reflection of signals. In other examples, the lens 106 may be made of polished glass. While the lens 106 is shown as a generally flat surface in this example, the lens 106 and/or the interface gasket 312 may have any appropriate lens geometry and/or features including, but not limited to, concave shapes, round shapes, prism shapes, wave shapes or any combination of the above, etc. to function as reflective components for purposes of coupling detection.

Figure 4C:
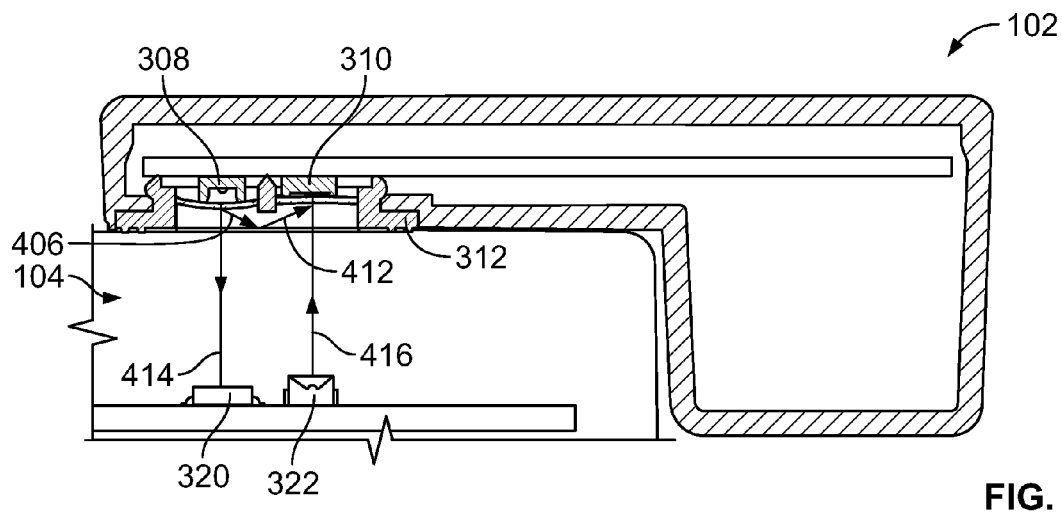
FIG. 4C is another cross-sectional view of the example module and the example terminal of FIG. 1 coupled together.

FIG. 4C is another cross-sectional view of the example module 102 and the example terminal 104 of FIG. 1 coupled together. In this example, the module 102 has already determined that the module 102 is coupled to the terminal 104 based on a reflected portion of a transmitted signal, which is transmitted from the transmitter 308, being detected at the receiver 310. After verification and/or determination that the module 102 is coupled to the terminal 104, two-way communications between the module 102 and the terminal 104 are enabled. In particular, the transmitter 308 of the illustrated example transmits a signal 414 across the interface gasket 312 and to the receiver 320 of the terminal 104. Likewise, the transmitter 322 of the illustrated example transmits a signal 416 across the interface gasket 312 and to the receiver 310.

In some examples, while this two-way communication is occurring (e.g., while the signals 414, 416 are being transmitted), the receiver 310 simultaneously and/or continuously verifies that the reflected signal 412 from the signal 406 is being received from a reflection portion of the signal 414. In some examples, the power provided to the transmitter 308 and/or the receiver 310 is increased based on detecting the reflected signal from the transmitter 308, thereby allowing a power saving mode of the module 302, for example, when there is no reflected signal detected at the receiver 310. In some examples, a processor of the module 102 is able to determine and/or sort out which portion of signals received at the receiver 310 are due to reflected components from the transmitter 308. While the examples shown in this example are related to receiver/transmitter pairs, the examples disclosed herein may be applied to combined receiver/transmitter transceivers, for example.

Figure 5:
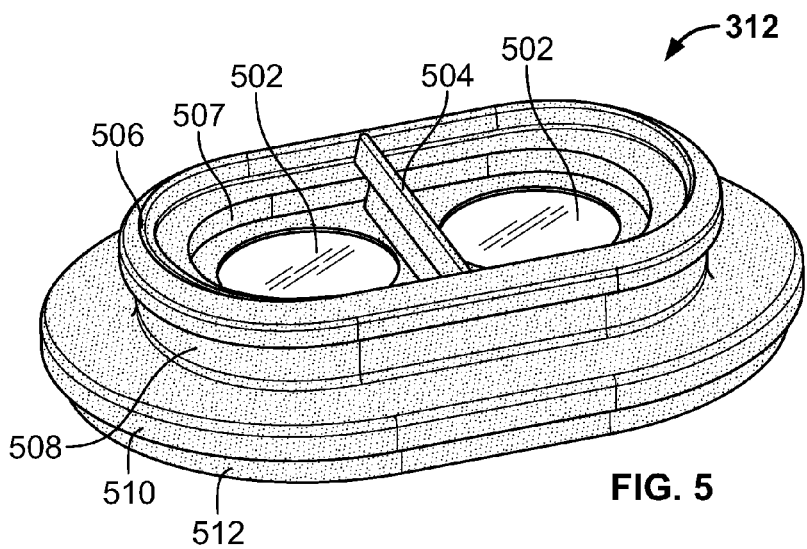
FIG. 5 is an isometric view of an example interface gasket of the example interface system of FIG. 3.

FIG. 5 is an isometric view of the interface gasket 312 of the example interface system 300 of FIG. 3. The interface gasket 312 of the illustrated example includes the aforementioned translucent portion 502, in which the remaining surfaces of the interface gasket 312 are relatively opaque, an isolating wall 504, an annular lip 506, a recess 507, an outer wall 508 defined by the recess 507, an annular step 510 and an interface (e.g., a contact portion) 512.

During operation, the translucent portion 502 allows signals (e.g., infrared signals, etc.) to pass through the interface gasket 312 while maintaining a substantially sealed interface (e.g., a substantially sealed zone) between a module and a terminal. The isolating wall 504 of the illustrated example prevents signals from a transmitter from reflecting back to a receiver when a module is not coupled to a terminal, for example. The annular lip 506 of the illustrated example allows the interface seal to be retained by features (e.g., the retention tabs 304) of a module or terminal. In this example, the recess 507 allows at least a portion of a transmitter and/or a receiver to be positioned within the interface gasket 312, thereby reducing a gap between the transmitter and/or the receiver associated with a module relative to a transmitter or receiver associated with the terminal.

In some examples, the outer wall 508 is used to align the interface gasket 312 to a module and/or a terminal. In this example, the wall 508 defines an outer recess of the interface gasket 312 to allow alignment and/or retention features of a mating part to contact and/or position the interface gasket 312. The annular step 510 of the illustrated example extends outward (e.g., generally radially outward) in relationship to the outer wall 508 and at least partially defines the interface portion 512, which contacts a surface of another mating part to define an interface (e.g., a sealed interface).

In this example, the interface gasket 312 is made of an elastomeric material (e.g., silicone). Additionally or alternatively, the interface 312 is made of a partially painted silicone and/or a bi-material elastomer. In some examples, the non-translucent portion is defined by painting the interface gasket 312 while the translucent portion 502 of the interface gasket 312 is molded in a transparent material. In some examples, the translucent portion 502 is co-molded and/or two-shot molded with the non-translucent portion of the interface gasket 312 (e.g., two different molded portions and/or materials). In some examples, the translucent portion 502 is insert molded. In some examples, the non-translucent portion is black (e.g., molded black) and/or colored (e.g., painted) black. While a black color is described in this example, any appropriate color may be used. Selected colors may vary based on desired absorbing capabilities, manufacturability and/or cost, etc.

Figure 6:
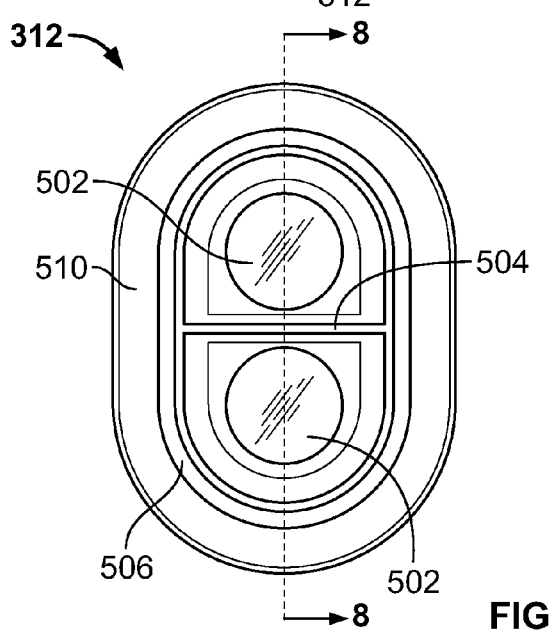
FIG. 6 is a top view of the example interface gasket of FIG. 5.

FIG. 6 is a top view of the example interface gasket 312 of FIG. 5 as used in the interface system 300 of FIG. 3. In this view, the overall layout of the interface gasket 312 is seen. In this example, the interface gasket 312 has a substantially semi-oval shape. While a semi-oval shape is shown in the examples disclosed herein, any appropriate shape may be used including circular, semicircular, rectangular, or parallelogram, etc. The isolating wall 504 of the illustrated example substantially isolates a transmitter side from a receiver side of the translucent portion 502 and may contact and/or rest on a printed circuit board. In this example, the annular lip 506 and the annular step 510 generally follow the overall shape of the interface gasket 312, but in other examples the annular lip 506 and/or the annular step 510 may differ from the overall shape to match geometry of a component that the interface gasket 312 is to be coupled to. The substantially symmetric shape of the example interface gasket 312 seen in FIG. 6 allows for greater ease with molding and/or improved manufacturability of the interface gasket 312.

Figure 7:
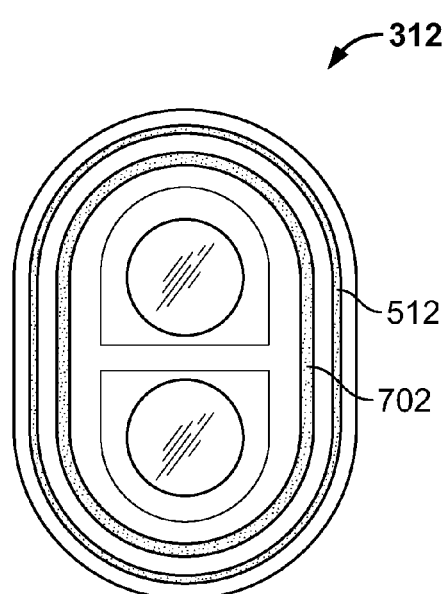
FIG. 7 is a bottom view of the example interface gasket of FIG. 5.

FIG. 7 is a bottom view of the example interface gasket 312 of FIG. 5 as used in the interface system 300 of FIG. 3. In this view, the interface portion 512 described above in connection with FIG. 5 is shown along with an additional inner interface portion 702. In this example, both the interface portions 512 and 702 protrude from the annular step 510 and are used to contact and/or compress against a mating surface (e.g., a mating surface of another device such as the terminal 104) to seal the interface gasket 312 to the mating surface. In this example, the interface portions 512 and 702 are shaped similarly and generally match the overall shape of the interface gasket 312. However, in some examples, the interface portions 512 and 702 have different shapes from one another and/or the interface gasket 312 to accommodate different features and/or designs of mating components.

Figure 8:
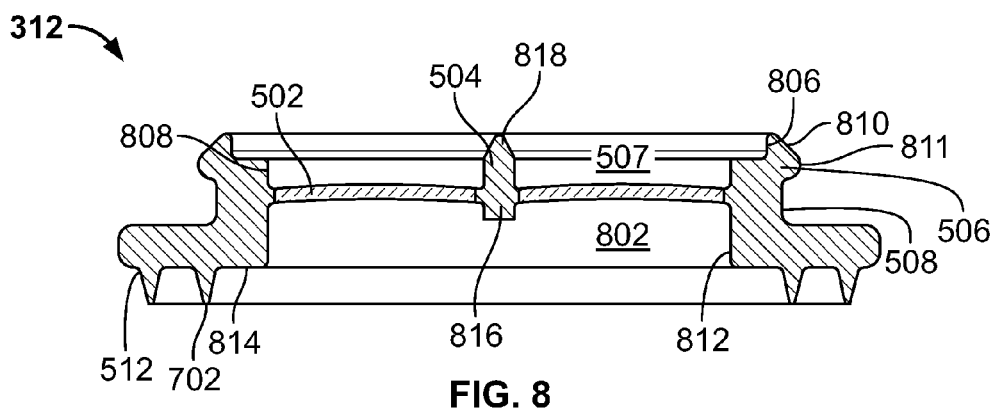
FIG. 8 is a detailed cross-sectional view of the example interface gasket of FIG. 5 along a line 8-8 of FIG. 6.

FIG. 8 is a detailed cross-sectional view of the example interface gasket 312 of FIG. 5 as used in the interface system 300 of FIG. 3 along a line 8-8 of FIG. 6. The translucent portion 502 of the illustrated example divides the recess 507 from a sealing recess (e.g., a substantially sealed zone) 802, which defines a substantially isolated volume from the environment when the interface gasket 312 is biased against (e.g., compressed against) a mating surface of another component (e.g., a mating surface of the terminal 104). In some examples, the recess 507 may receive a transmitter or receiver or a portion of the transmitter or the receiver. In other examples, a transmitter or a receiver do not extend into the recess 507.

The recess 507 of the illustrated example is defined by a first inner wall 806 and a second inner wall 808, which has a smaller diameter than the inner wall 806. Consequently, the first inner wall 806 and the second inner wall 808 define a stepped profile. Further, the annular lip 506 of the illustrated example has a tapered profile (e.g., a draft) 810 and a rounded edge (e.g., a round) 811, both of which facilitate assembly and/or sealing of the interface gasket 312 to an assembly feature such as the retention tabs 304 of FIG. 3, for example, by allowing the interface gasket 312 to be aligned and/or be displaced (e.g., flexed) to engage coupling features (e.g., movable tabs, a recess, alignment features, etc.) of the components. In some examples, the rounded edge 811 allows greater ease of installation (e.g., as opposed to a sharp edge).

The sealing recess 802 of the illustrated example is at least partially defined by an inner wall 812 and a bottom surface 814. In some examples, the sealing recess is also defined by a protrusion 816 that extends from the isolating wall 506 and may be used to isolate and/or further isolate signals between the receiver side and the transmitter side. The interface portions 512 and 702 of the illustrated example extend (e.g., protrude) from the bottom surface 814 and when the interface gasket 312 is pushed and/or compressed against a mating surface of another component, form a seal (e.g., when the module 105 is assembled to the terminal 104). A mechanical bias to compress the interface portions 512 and 702 against the mating surface may be provided by a coupling piece such as the coupling piece 202 and/or the latch 107 shown above in connection with FIG. 2, or any other appropriate mechanism to provide a bias for the seal (e.g., a designed interference resulting in a designed compression of the sealing interface 312, etc.). In some examples, the interface portions 512 and 702 have a tapered shape (e.g., a draft) to more effectively provide a seal to the mating surface by allowing a peripheral end of the interface portions 512 and 702 to have greater displacements/deformations than portions near the bottom surface 814.

In some examples, the translucent portion 502 is approximately 0.4-1.2 millimeters (mm) thick and the isolating wall is approximately 1.0 mm thick. In some examples, the isolating wall 504 may have a tapered portion 818 for greater ease of assembly and/or more effective sealing.

Figure 9:
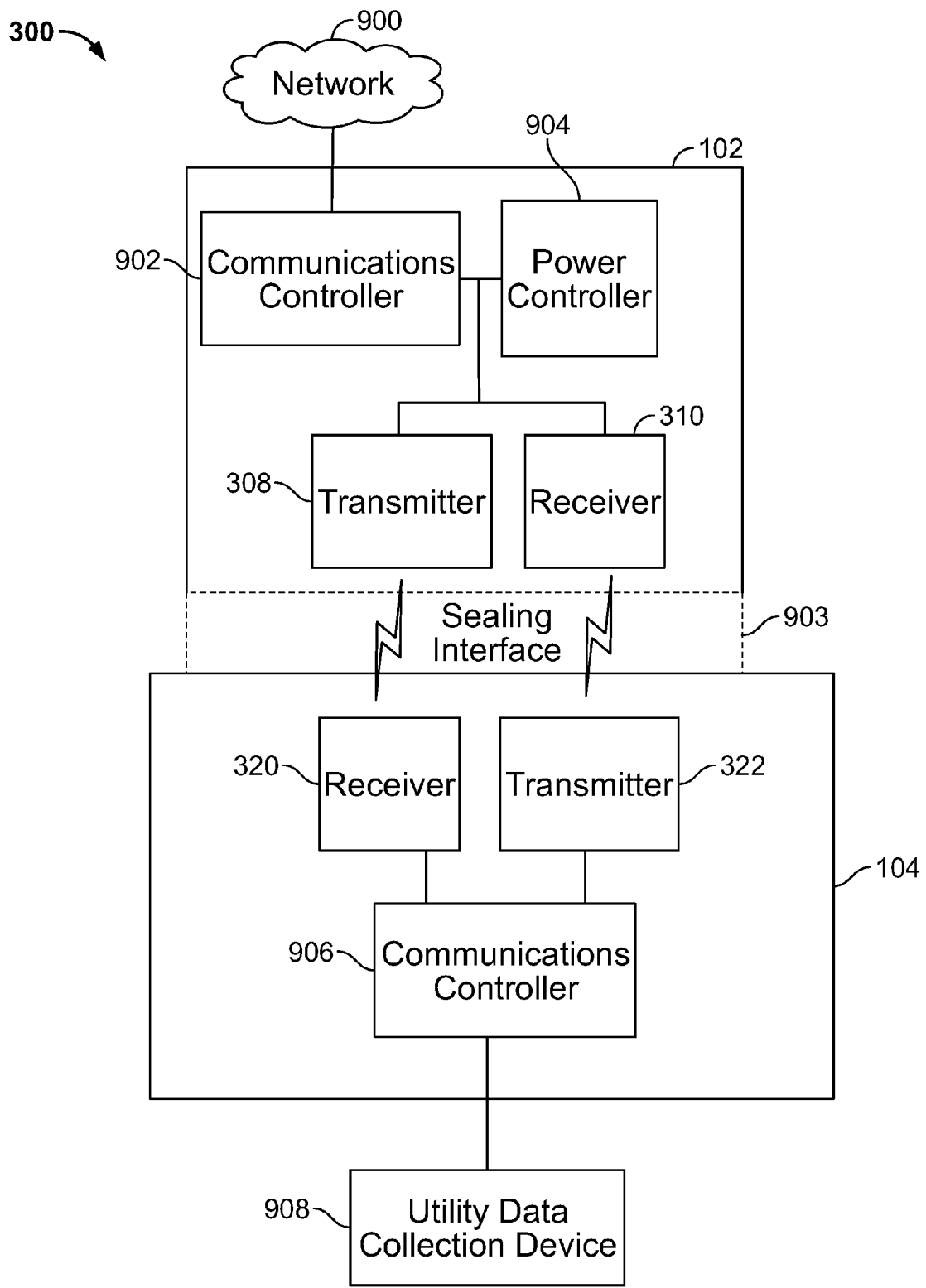
FIG. 9 is a schematic representation of the example interface system of FIG. 3.

FIG. 9 is a schematic representation of the example interface system 300, in which the module 102 is communicatively coupled to the terminal 104 via a sealing interface 903 such as the interface gasket 312. In this example, the module 102 is also communicatively coupled to a network 900 and includes a communications controller 902, a power controller 904, the transmitter 308 and the receiver 310. The terminal 104 of the illustrated example includes the receiver 320, the transmitter 322, and a communications controller 906. In this example the terminal 104 is also communicatively coupled to a utility data collection device (e.g., a sensor apparatus and/or a sensor junction, a utility heat sensor, etc.) 908.

The transmitter 308 of the illustrated example transmits data across the sealing interface 903 to the receiver 320 of the terminal 104. Likewise, the transmitter 322 transmits data across the sealing interface 903 to the receiver 310 of the module 102. In this example, the communications controller 902 determines and/or has determined whether the module 102 and the terminal 104 are coupled together when reflected signals from the transmitter 308 are reflected from the terminal 104, for example, and received at the receiver 310. In this example, the communications controller 902 also transfers data received from the terminal 104 to the network 900. The power controller 904 of the illustrated example determines whether to provide and/or how much power to the transmitter 308 and/or the receiver 310 based on whether the communications controller 902 has determined that the module 102 is coupled to the terminal 104. Additionally or alternatively, the power controller 904 may partially power (e.g., provide reduced power to) the transmitter 308 and/or the receiver 310 or other communication circuitry based on detected conditions (e.g., when the module 102 is not coupled to the terminal 104, etc.).

The communications controller 906 of the illustrated example may coordinate transmitting and/or transmit utility data to the module 102 via the transmitter 322 after receiving the data from the utility data collection device 908. In some examples, the communications controller 906 continuously receives and/or collects data from the utility data collection device for transmission to the module 102. While the example shown in FIG. 9 shows the power controller 904 as part of the module 102, the power controller 904 may be associated with the terminal 104 instead. Alternatively, the transmitter 322 may transmit a signal to be reflected from the module 102 and detected at the receiver 320, thereby enabling communications between the module 102 and the terminal 104. While the sealing interface 903 is shown in the illustrated example as part of the module 102, the sealing interface 903 may be a component of the terminal 104 or simply be positioned between the module 102 and the terminal 104.

While an example manner of implementing the interface system 300 of FIG. 3 is illustrated in FIG. 9, one or more of the elements, processes and/or devices illustrated in FIG. 9 may be combined, divided, re-arranged, omitted, eliminated and/or implemented in any other way. Further, the example communications controller 902, the example power controller 904, the example transmitter 308, the example receiver 310, the example receiver 320, the example transmitter 322, the example communications controller 906 and/or, more generally, the interface system 300 of FIG. 3 may be implemented by hardware, software, firmware and/or any combination of hardware, software and/or firmware. Thus, for example, any of the example communications controller 902, the example power controller 904, the example transmitter 308, the example receiver 310, the example receiver 320, the example transmitter 322, the example communications controller 906 and/or, more generally, the interface system 300 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, communications controller 902, the example power controller 904, the example transmitter 308, the example receiver 310, the example receiver 320, the example transmitter 322, and/or the example communications controller 906 is/are hereby expressly defined to include a tangible computer readable storage device or storage disk such as a memory, a digital versatile disk (DVD), a compact disk (CD), a Blu-ray disk, etc. storing the software and/or firmware. Further still, the example interface system 300 of FIG. 3 may include one or more elements, processes and/or devices in addition to, or instead of, those illustrated in FIG. 9, and/or may include more than one of any or all of the illustrated elements, processes and devices.

Figure 10:
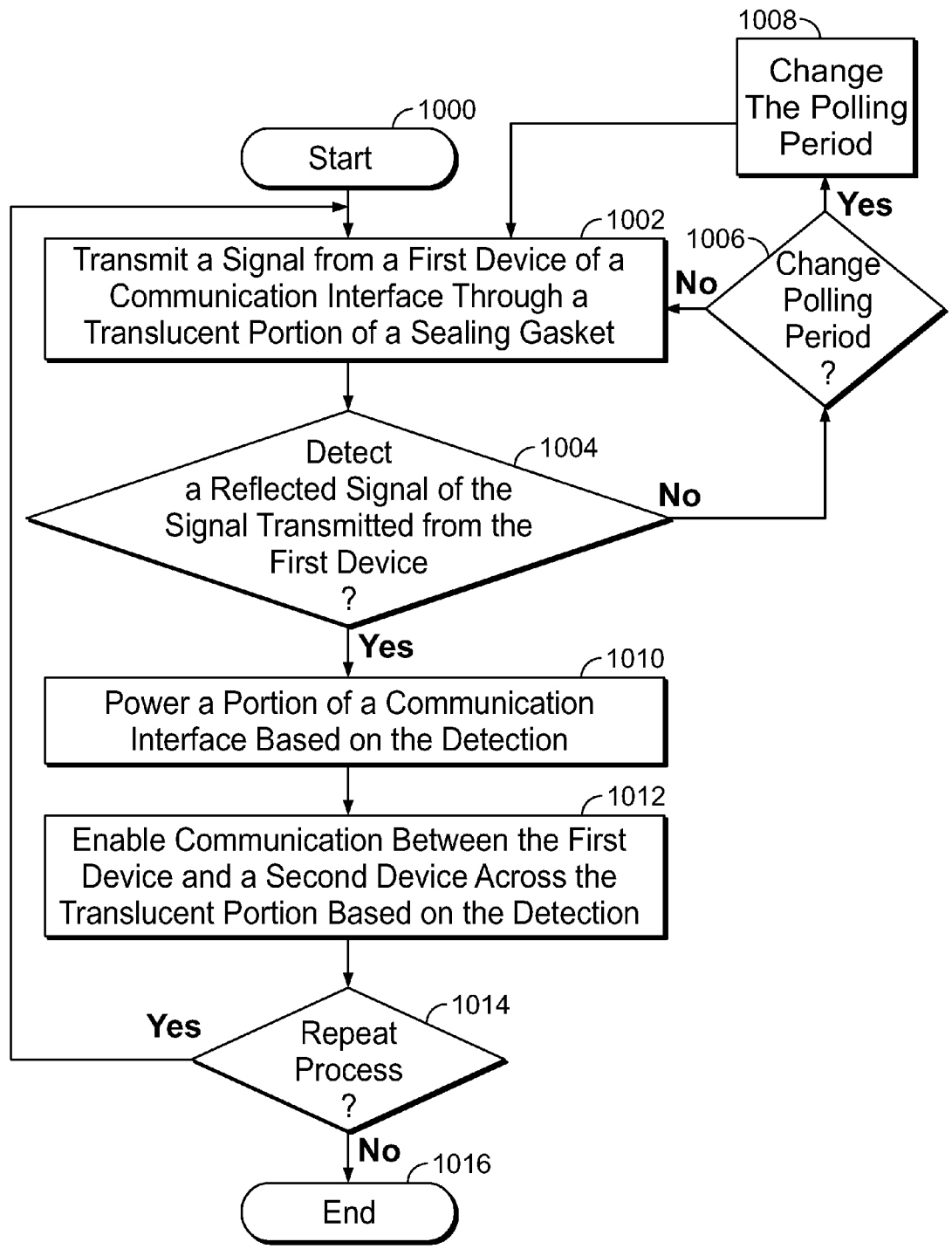
FIG. 10 is a flowchart representative of an example process for implementing the example interface of FIG. 3.

A flowchart representative of example machine readable instructions for implementing the example interface system 300 of FIG. 3 is shown in FIG. 10. In this example, the machine readable instructions comprise a program for execution by a processor such as the processor 1112 shown in the example processor platform 1100 discussed below in connection with FIG. 11. The program may be embodied in software stored on a tangible computer readable storage medium such as a CD-ROM, a floppy disk, a hard drive, a digital versatile disk (DVD), a Blu-ray disk, or a memory associated with the processor 1112, but the entire program and/or parts thereof could alternatively be executed by a device other than the processor 1112 and/or embodied in firmware or dedicated hardware. Further, although the example program is described with reference to the flowchart illustrated in FIG. 9, many other methods of implementing the example interface system 300 may alternatively be used. For example, the order of execution of the blocks may be changed, and/or some of the blocks described may be changed, eliminated, or combined.

As mentioned above, the example processes of FIG. 10 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example process of FIG. 10 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 10 is a flowchart representative of an example process for implementing the example interface system 300 of FIG. 3. The process begins at block 1000 where a first device (e.g., the module 102) is coupled to a second device (e.g., the terminal 104) for data communications between the first and second devices (block 1000). In this example, both of the first and second devices are located in an outdoors environment.

The first device of the illustrated example transmits (e.g., by the transmitter 308) a signal (e.g., an infrared signal) through a translucent portion (e.g., the translucent portion 502) of a sealing gasket (e.g., the interface gasket 312) (block 1002). In this example, the sealing gasket is positioned between the first and second devices and is assembled and/or coupled to the second device and, thus, is pressed against the first device to seal against the first device, for example. In some examples, both the first and second devices have sealing gaskets such as the interface gasket 312 and both of the sealing gaskets may engage one another to seal the first and second devices to one another.

The first device then determines (e.g., by the detector 310) whether a reflected signal of the signal transmitted from the first device has been detected (block 1004). In this example, the reflected signal reflects from a surface of the second device. In other examples, a compression and/or movement of the sealing gasket causes the sealing gasket to change shape and thereby reflect the transmitted signal, thereby foregoing the signal being reflected off of the second device. The compression and/or movement of the sealing gasket may result from the sealing gasket being biased against (e.g., pressed against) a mating device and/or component, for example.

If the reflected signal has not been detected (block 1004), it is then determined whether a polling period of the transmitted signal should be changed (block 1006). If the determination is not to change the polling period is made, then the process returns to block 1002 (block 1002). Such a determination may occur through accelerometers and/or light detectors of the first device indicating that the first device is being moved and/or aligned to the second device, for example. Additionally or alternatively, the polling period is changed (block 1008) based on a last detected reflection corresponding to a transmitted signal. For example, the polling period may increase after not detecting a reflection for a pre-defined period of time (e.g., changing the polling time from 3 seconds to 30 seconds after not detecting a reflection for an hour). In these examples, decreased use of the transmitter and/or receiver based on reduced polling (e.g., transmission of detection signals) when connections are not detected for a defined period of time, for example, may allow significant reduced energy consumption. The process then returns to block 1002 (block 1002).

If the reflected signal has been detected by the first device (block 1004), power management circuitry (e.g., the power controller 904) causes a transmitter and/or a receiver of the first device to be turned on or to leave a power savings mode, in which reduced power is provided to one or more circuits related to signal communications (block 1010).

Once the first device determines that there is a connection between the first device and the second device (e.g., the first and second devices are coupled together) based on the reflected signal, communication between the first device and the second device is enabled across the translucent portion of the sealing gasket (block 1012). In some examples, this communication is only continued as long as reflected signals are continuously detected at the first device (e.g., a connection pulse or clock must be continuously detected) to enable communications between the first and second devices. In some examples, communication between the first and second devices is only maintained for a pre-defined time period after the last detected reflection (e.g., communication between the first and second devices seizes after a minute of not detecting the reflection and/or the communication times out after reflection detections have stopped).

Next, it is determined if the process is to be repeated (block 1014). If the process is to be repeated (block 1014), the process repeats (block 1000). Otherwise, if the process is not to be repeated (block 1014), the process ends (block 1016). In some examples, the process may end when the reflected signal is no longer detected and, thus, the reflected signal are to be maintained during communications. In some examples, when the process ends, power is reduced (e.g., turned off) to one or more communication components of the first device and/or the second device.

Figure 11:
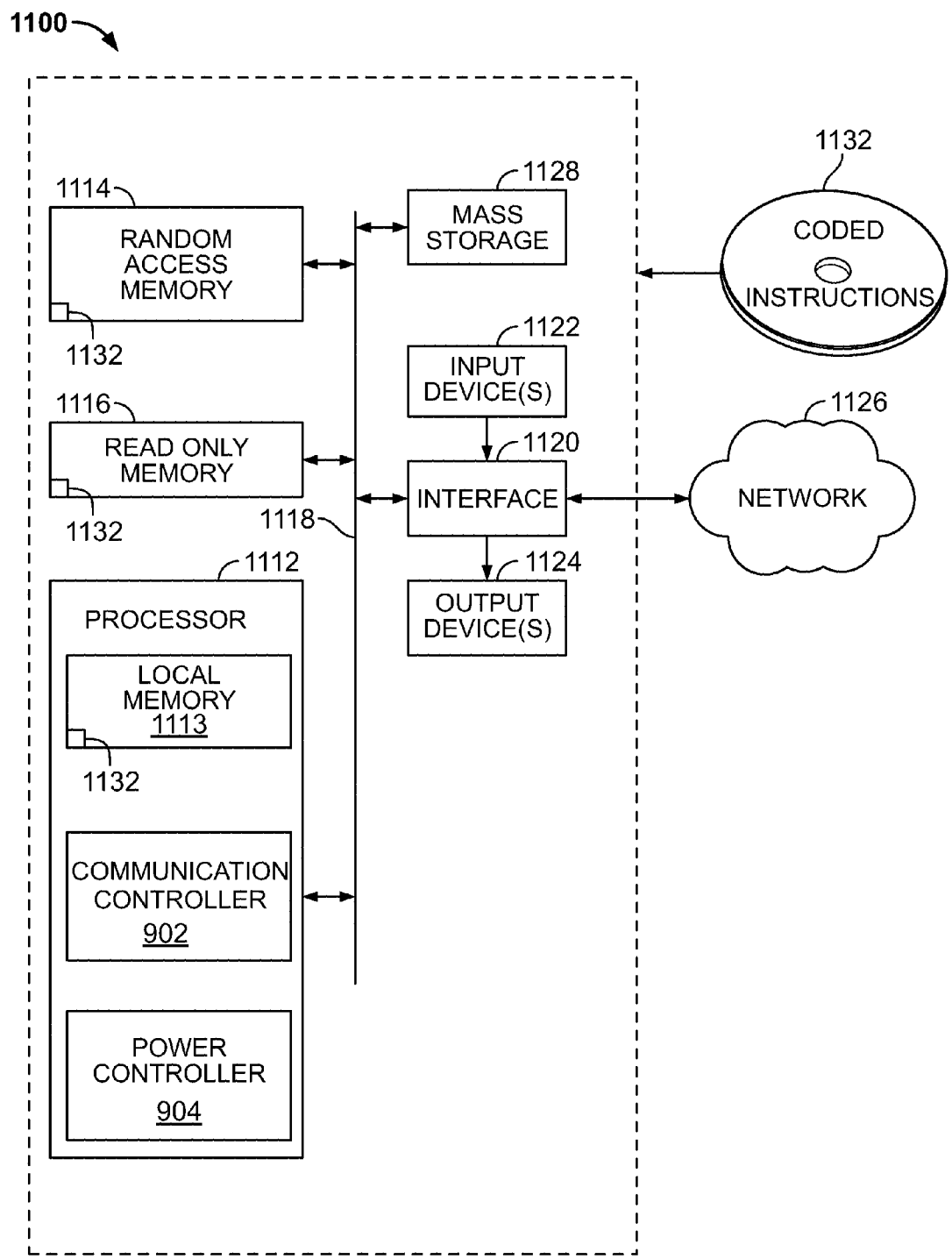
FIG. 11 is a block diagram of an example processor platform capable of executing machine readable instructions to implement the process of FIG. 10.

FIG. 11 is a block diagram of an example processor platform 1100 capable of executing the instructions of FIG. 10 to implement the interface system 300 of FIG. 9. The processor platform 1100 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1100 of the illustrated example includes a processor 1112. The processor 1112 of the illustrated example is hardware and includes the communication controller 902 and the power controller 904, for example. For example, the processor 1112 can be implemented by one or more integrated circuits, logic circuits, microprocessors or controllers from any desired family or manufacturer.

The processor 1112 of the illustrated example includes a local memory 1113 (e.g., a cache). The processor 1112 of the illustrated example is in communication with a main memory including a volatile memory 1114 and a non-volatile memory 1116 via a bus 1118. The volatile memory 1114 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1116 may be implemented by flash memory and/or any other desired type of memory device. Access to the main memory 1114, 1116 is controlled by a memory controller.

The processor platform 1100 of the illustrated example also includes an interface circuit 1120. The interface circuit 1120 may be implemented by any type of interface standard, such as an Ethernet interface, a universal serial bus (USB), and/or a PCI express interface.

In the illustrated example, one or more input devices 1122 are connected to the interface circuit 1120. The input device(s) 1122 permit(s) a user to enter data and commands into the processor 1112. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1124 are also connected to the interface circuit 1120 of the illustrated example. The output devices 1124 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1120 of the illustrated example, thus, typically includes a graphics driver card, a graphics driver chip or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (e.g., an Ethernet connection, a digital subscriber line (DSL), a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, RAID systems, and digital versatile disk (DVD) drives.

The coded instructions 1132 of FIG. 11 may be stored in the mass storage device 1128, in the volatile memory 1114, in the non-volatile memory 1116, and/or on a removable tangible computer readable storage medium such as a CD or DVD.

From the foregoing, it will appreciate that the above disclosed methods and apparatus effective and relatively inexpensive sealing interfaces for communication interfaces. The examples disclosed herein allow power savings modes with respect to a sealed interface connection, whereby the interface connection may be automatically switched out of the power savings mode by automatic detection of components being coupled.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. While the examples disclosed herein are related to utility modules, the examples disclosed herein may be applied to any appropriate interfaces such as telecommunications systems, networking, etc.

What is claimed is:

1. An apparatus comprising:
 a translucent portion of a sealing gasket to allow signals to pass therethrough;
 a sealing wall of the gasket to define a substantially environmentally-isolated zone proximate the translucent portion;
 a transmitter to transmit a signal across the translucent portion; and
 a receiver to detect a reflected signal corresponding to the transmitted signal, wherein the detection enables data communications across the translucent portion, and wherein the reflected signal is to be reflected from a surface on an opposite side of the translucent portion from the transmitter and receiver.

2. The apparatus as defined in claim 1, wherein a portion of the translucent portion contacts the transmitter.

3. The apparatus as defined in claim 1, wherein the data communications are related to a utility metering communication system.

4. The apparatus as defined in claim 1, wherein the transmitter and the receiver are infrared-based.

5. The apparatus as defined in claim 1, wherein the translucent portion is approximately 0.4 mm to 1.2 mm thick.

6. The apparatus as defined in claim 1, wherein the surface comprises a mirror surface.

7. The apparatus as defined in claim 1, wherein the surface comprises a tinted surface.

8. A method comprising:
transmitting a signal from a transmitter of a first device through a translucent portion of a sealing gasket, wherein the sealing gasket defines a substantially environmentally-isolated zone proximate the translucent portion;
detecting, at a detector of the first device, a reflected signal of the signal transmitted from the first device, the reflected signal reflected from a second device on an opposite side of the translucent portion from the first device; and
enabling communication between the first and second devices across the translucent portion based on the detection using the transmitter and the detector.

9. The method as defined in claim 8, further comprising powering communication circuitry, based on the detection, to enable communication between the first and second devices across the translucent portion.

10. The method as defined in claim 8, further comprising transitioning a communication circuitry from a power-saving mode based on the detection.

11. The method as defined in claim 8, wherein the signal is infrared-based.

12. The method as defined in claim 11, wherein the communication between the first and second devices is infrared-based.

13. The method as defined in claim 8, wherein the signal is reflected via a mirror surface of the second device.

14. An apparatus comprising:
a module comprising a first endpoint of a communication interface;
a utility meter comprising a second endpoint of the communication interface; and
a sealing interface between the first and second communication endpoints, the sealing interface defining a substantially environmentally-isolated zone at the communication interface and comprising a translucent portion, wherein the module is to transmit a signal from the first endpoint and detection, at the first endpoint, of a corresponding reflected signal from a surface of the utility meter is to enable communication between the first and second endpoints across the translucent portion.

15. The apparatus as defined in claim 14, wherein the sealing interface comprises molded silicone.

16. The apparatus as defined in claim 14, wherein the translucent portion comprises a portion of a wall of the sealing interface.

17. The apparatus as defined in claim 16, wherein a transmitter of the communication interface contacts the translucent portion.

18. The apparatus as defined in claim 14, further comprising a clasp or a latch to compress the sealing interface.

19. The apparatus as defined in claim 14, wherein the sealing interface further defines a second substantially environmentally-isolated zone of the module.

20. The apparatus as defined in claim 14, wherein the sealing interface is coupled to the utility meter.

* * * * *